United States Patent [19]

Bonny et al.

[11] Patent Number: 4,749,615

[45] Date of Patent: Jun. 7, 1988

[54] SEMICONDUCTOR DOPANT SOURCE

[75] Inventors: Alan M. Bonny; Jack Wilson, both of Shaker Heights; Robert A. Gustaferro, Rocky River, all of Ohio

[73] Assignee: Stemcor Corporation, Cleveland, Ohio

[21] Appl. No.: 925,428

[22] Filed: Oct. 31, 1986

[51] Int. Cl.$^4$ .......................... B32B 3/26; B32B 9/00; H01L 21/225

[52] U.S. Cl. .................... 428/310.6; 252/950; 252/951; 264/57; 264/60; 428/426; 428/432; 428/446; 428/450; 428/472; 428/688; 428/689; 428/699; 428/700; 428/701; 428/702; 428/704; 428/312.8; 437/168

[58] Field of Search ............... 428/688, 699, 689, 701, 428/700, 702, 704, 472, 446, 450, 426, 432, 312.6, 312.8; 252/950, 951; 148/180, 186, 189, D2, 7, D40, 41, 42; 437/168; 264/57, 60

[56] References Cited

U.S. PATENT DOCUMENTS

| | | | |
|---|---|---|---|
| 3,849,344 | 11/1974 | McMurty et al. | 252/951 |
| 3,920,882 | 11/1975 | Venkatu | 428/539 |
| 3,954,525 | 5/1976 | Myles et al. | 252/951 |
| 3,962,000 | 6/1976 | Rapp | 148/189 |
| 3,998,668 | 12/1976 | Florence et al. | 252/951 |
| 4,152,286 | 5/1979 | Crosson et al. | 252/950 |
| 4,379,006 | 4/1983 | Rapp | 148/189 |
| 4,490,192 | 12/1984 | Gupta et al. | 148/188 |
| 4,525,429 | 6/1985 | Kaiser et al. | 428/566 |
| 4,526,826 | 7/1985 | Ten Eyck et al. | 428/131 |
| 4,571,366 | 2/1986 | Thomas et al. | 428/446 |
| 4,588,455 | 5/1986 | Genser | 148/189 |
| 4,592,793 | 6/1986 | Hovel et al. | 252/951 |
| 4,596,716 | 6/1986 | De Munda et al. | 427/243 |

FOREIGN PATENT DOCUMENTS 0044736 9/1973 Japan ................................ 252/950

OTHER PUBLICATIONS

Kahlenberg et al., "Reduction by Means of Silicon", 39, Trans. of Am. Electrochem. Soc., (1921), pp. 377–416.
Marshakov et al., "Thermal Oxidation of Silicon in the Presence of Antimony Oxide", 50, Russ. J. of Phys. Chem., (1976), pp. 1840–1842.
Ugai et al., "Certain General Features of Reactions of Si with Metal Oxides", 13, Sov. Inorg. Materials, (1977), pp. 1611–1613.

Primary Examiner—Ellis P. Robinson
Assistant Examiner—James B. Monroe
Attorney, Agent, or Firm—Jeffrey A. Wyand; Larry W. Evans

[57] ABSTRACT

Semiconductor dopant sources are prepared by mixing particles of elemental silicon and at least one dopant oxide and heating the mixture to a temperature sufficient to initiate a reduction reaction while excluding external oxygen sources from affecting the reaction. The reaction can be initiated in a furnace, provided the gaseous ambient is controlled, or can be initiated in air if the mixture is heated sufficiently rapidly, e.g. by heating with electromagnetic energy at microwave frequencies. The dopant source produced includes a fused, amorphous matrix of silicon-oxygen-dopant atoms containing inclusions of elemental dopant and, preferably, inclusions of elemental silicon. Embodiments of sources prepared from antimony trioxide slowly evolve antimony, have a long life and repeatedly and predictably dope silicon at commerically useful levels.

29 Claims, 8 Drawing Sheets

SEMICONDUCTOR DOPANT SOURCE

BACKGROUND

In the art of manufacturing semiconductor devices and particularly integrated circuits, introduction of dopant elements into semiconductor bodies is an essential step. Numerous methods of placing atoms of dopant elements, such as boron, arsenic and phosphorus, in silicon and other semiconductors are known and practiced in the art.

In a long established doping process, a source, such as a crucible containing the dopant element, and a boat carrying wafers of the semiconductor body to be doped, are placed in a furnace. An appropriate atmosphere is maintained in the furnace. The dopant source is then raised to a sufficient temperature to vaporize dopant atoms and transport them to the surface of the semiconductor wafers. The wafers are held at a temperature sufficient to diffuse into them the dopant atoms that contact the wafer surfaces.

In a more modern version of the process just described, the dopant atoms are contained on the surfaces of a porous or non-porous solid dopant source, usually in a planar form. A planar source is disposed in a furnace, usually between and closely spaced from two semiconductor bodies to be doped. The assembly of dopant sources and wafers is placed in a furnace in a controlled atmosphere and the temperature is raised so that dopant atoms are evolved from the source, contact the semiconductor body and are diffused into it. Examples of such porous sources are referred to in U.S. Pat. Nos. 4,525,429 for "Porous Semiconductor Dopant Carriers" and 4,596,716 for "Porous Silicon Nitride Semiconductor Dopant Carriers." An example of a non-porous source is described in U.S. Pat. No. 3,920,882 for "N-Type Dopant Source". According to the latter patent, in its Part D of Example 3, an embodiment of an antimony dopant source evolved 0.03 grams per minute of material during a diffusion at 1220° C. This rate of weight loss means that such dopant sources will not have a long life, i.e. will not survive a large number of doping cycles.

Liquid dopant sources may also be painted on a semiconductor body to be doped. Typically the body is spun while a liquid is dropped on it. The spinning spreads the liquid dopant source uniformly and dries it. Thereafter, the semiconductor body is heated to diffuse dopant atoms from the dried layer into the semiconductor body. This process is particularly undesirable because of the direct contact of the semiconductor surface with a foreign object, resulting in surface contamination and damage. Examples of such dopant sources are described in U.S. Pat. Nos. 4,571,366 for "Process for Forming a Doped Oxide Film and Doped Semiconductor" and 4,490,192 for "Stable Suspensions of Boron, Phosphorus, Antimony and Arsenic Dopants."

In still another related doping process, mixtures, such as solutions, pastes or slurries, containing dopant atoms, usually as an oxide, along with other ingredients are painted on the surface of a non-reacting substrate, such as silicon. The mixture is dried, usually to drive off a solvent, to form a solid or semi-solid layer on the substrate. These sources are placed in a furnace with semiconductor bodies to be doped. Thereafter, the temperature is raised to transport dopant atoms to the semiconductor body for diffusion into it. An example of such a dopant source is described in U.S. Pat. No. 4,588,455 for "Planar Diffusion Source." In our experiments, embodiments of sources of the type described in that patent and incorporating antimony produced highly unpredictable doping and dopant concentrations in semiconductor bodies.

A more recently developed doping technique that is widely used in integrated circuit manufacture is ion implantation. In that process a gaseous source of dopant atoms is introduced to a chamber where the dopant atoms are ionized. The ionized atoms are then accelerated toward and become embedded in the semiconductor wafer being doped. This technique provides good control of the dosage and location of doping. However, crystal structure of the doped semiconductor is damaged by the high energy dopant ions, particularly when the dosage is high. Moreover, the apparatus required for ion implantation is extremely complex and expensive. In addition, the dopant source gases used are highly toxic.

A low cost, long lasting, inexpensive semiconductor dopant source is needed that can predictably dope semiconductor wafers, particularly silicon. Of the dopants that produce n-type conductivity, antimony is a particularly useful one for widely used processes. For example, semiconductor manufacturers frequently wish to establish "buried" layers in their devices. Buried layers are relatively deeply disposed in a silicon wafer and so are prepared in one of the earlier steps of a process that may include many subsequent, relatively high-temperature processes. The dopant atoms in the buried layer, e.g. a buried collector of a bipolar transistor or an isolating buried layer in an MOS device, diffuse in the subsequent high-temperature processes, spreading out junctions and moving their locations. Antimony is a desirable dopant for buried layers since it diffuses less than other n-type dopants (phosphorus and arsenic). Moreover, antimony is less volatile than arsenic in the conditions of temperature and atmosphere that are used to grow silicon epitaxially in the course of manufacturing integrated circuits. As a result, there is less autodoping of a silicon epitaxial layer by an antimony doped substrate than by an arsenic doped substrate. Therefore, a low cost, long lasting, inexpensive doping source that can predictably dope silicon with antimony would be particularly useful.

SUMMARY OF THE INVENTION

In accordance with the invention, a novel semiconductor dopant source is provided that is inexpensive, that has a long life and achieves repeatable, predictable doping levels in semiconductor bodies. Embodiments of the dopant source are particularly effective as sources of antimony.

A source according to the invention is formed by reacting a mixture of finely divided particles of silicon and at least one dopant oxide in such a way that oxygen from external sources is prevented from participating in the reaction. The dopant oxide (or oxides) is reduced and a fused, amorphous matrix of silicon-oxygen-dopant is formed in the reaction. The matrix contains elemental dopant inclusions and, if as is preferred, the mixture contains an excess of silicon, inclusions of elemental silicon. A particularly useful doping source can be made by employing antimony trioxide as the dopant oxide to produce an antimony source.

The mixture can be reacted by heating it to a sufficient temperature to initiate the reduction reaction. The mixture may be heated in a furnace, provided the gaseous ambient is controlled to exclude external oxygen from the mixture. The mixture may be heated by bombarding it with electromagnetic energy at radio frequencies or at microwave frequencies. The mixture may directly absorb the energy or may be disposed on, between or within an absorber of electromagnetic energy. When energy at microwave frequencies is used, the reaction proceeds so quickly that it can be performed in air with no special measures taken to exclude extraneous oxygen. The mixture may be formed into a desired shape, e.g. a wafer, before heating or may be heated, preferably under pressure, as a cylinder that is later sliced into wafers. For an antimony source, the mixture is heated at least to 550° C. to 600° C. to initiate the reduction reaction, although it is preferred to heat the mixture to a higher temperature to ensure the completion of the reaction. The reaction can also be initiated with the mixture disposed on a refractory foam support. Supports providing mechanical stability are important for antimony sources containing a very high proportion of antimony.

Antimony sources according to the invention slowly evolve dopant atoms and produce predictable sheet resistivities in doped silicon over a very long dopant source life. Embodiments of the invention have produced acceptable doping levels in silicon wafers throughout more than 18 one-half hour doping cycles at 250° C. The slow evolution of dopant atoms by the novel sources also extends the life of diffusion apparatus since the rate of its doping (i.e. contamination with dopant atoms) and of the surrounding processing area is reduced.

DETAILED DESCRIPTION OF PREFERRED EMBOIDMENTS

Figure 1:
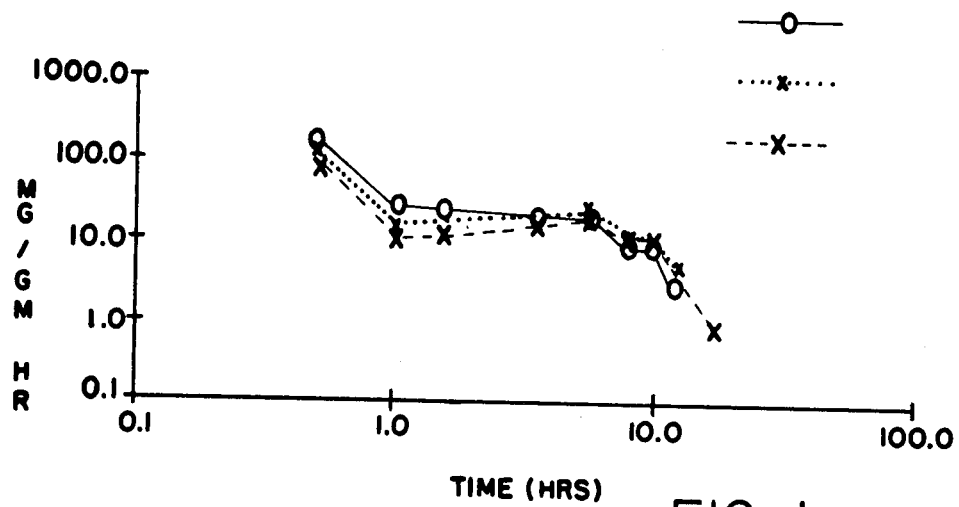
In FIG. 1 the measured rates of weight loss over time of embodiments of dopant sources according to the invention are plotted versus time at doping cycle temperature.

The preferred embodiment of a solid state dopant source according to the invention comprises a fused matrix of silicon-oxygen-dopant atoms containing inclusions of elemental dopant atoms. The matrix is also likely to contain inclusions of elemental silicon atoms because of the excess quantity of silicon atoms employed in formation of the source as explained below. The formation technique, resulting dopant source and doping method described here are not limited to a particular dopant. A particularly useful embodiment of the invention employs antimony as the dopant atom. Arsenic, phosphorus and boron dopant sources of the kind described may also be formed and used according to the invention. The description that follows is particularly directed to a dopant source for doping silicon, the most common commercial semiconductor material today. However, the dopant source described is plainly applicable to the doping of other semiconductors by known techniques.

The embodiment of the invention employing antimony as dopant is based on reducing an oxide of antimony, e.g. antimony trioxide, with silicon, while preventing oxygen from other sources from participating in the reaction. The principal reduction reaction is

$$2Sb_2O_3 + 3Si \rightarrow 3SiO_2 + 4Sb \qquad (1)$$

Another reaction that may take place simultaneously with reaction (1) is

$$Sb_2O_3 + SiO_2 \rightarrow SbSiO_x \qquad (2)$$

Reaction (1) is exothermic and occurs spontaneously when the reactants reach a temperature in the approximate range of 550° C. to 600° C.

A solid state antimony dopant source can be prepared by intimately mixing finely divided particles of antimony trioxide with finely divided particles of elemental silicon and raising the temperature of the mixture to between 500° C. and 900° C., and preferably between 500° and 600° C., to initiate reaction (1). In carrying out the reaction, it is important to prevent significant amounts of oxygen from sources other than the antimony trioxide from participating in the reaction. If other sources of oxygen, for example air, participate in the reaction, the antimony trioxide is not reduced to elemental antimony; instead, as we have confirmed, the antimony trioxide is converted to antimony tetraoxide, $Sb_2O_4$, which is useless as a dopant source. Oxides of other dopants such as arsenic, phosphorus, and boron and mixtures of them, may be used as source materials in reduction reactions to produce fused silicon-oxygen-dopant matrices containing elemental dopant (e.g., arsenic, phosphorus and boron or mixtures of them) inclusions as a dopant source.

The silicon-antimony trioxide mixtures used in the examples described below were prepared by placing the constituents together in preselected proportions in a ball mill. Powdered elemental silicon was used as the silicon constituent. The constituents were simultaneously ground into finely divided particles and mixed in the ball mill.

Two methods of heating the silicon-dopant oxide mixture to initiate the reduction reaction have been found particularly useful. The mixture may be heated in a conventional furnace to initiate the reaction provided that the gaseous ambient is controlled so that air or another oxygen source is prevented from reaching the mixture. In a furnace, exclusion of ambient oxygen, i.e. air, may be accomplished by flowing an inert gas through the furnace, around the exposed parts of the mixture. The noble gases are useful for excluding oxygen and the cheapest of them, argon, has been found effective in excluding oxygen during reduction reaction processing in a furnace. Heating times for completion of the reaction in a furnace are as long as one hour.

The mixture may also be heated in an induction furnace to initiate reaction (1). The formed mixture is placed inside a susceptor, e.g. a graphite sleeve that is plugged at each end. Frequently axial pressure is applied to the mixture by stressing the end plugs in a process called hot pressing. Thermal energy is transferred to the mixture by the susceptor which absorbs electromagnetic energy that is directed at it.

In a more advanced form of induction heating, the mixture may be heated by electromagnetic energy at a microwave frequency. The mixture, possibly after being formed into a desired shape by pressing, is placed on or inside an absorber of microwave frequency energy which is then bombarded with microwaves. We used microwaves at a frequency of 2545 MHz. Silicon carbide sheets are adequate microwave energy absorbers. The mixture may be sandwiched between two silicon carbide sheets or held inside a silicon carbide kiln. Silicon itself is an absorber of microwave energy and may be heated by microwaves without use of a separate absorber. Whether or not a separate absorber is used, the mixture may be disposed for heating in a cavity or spaced one quarter of a wavelength from a short circuited end of a waveguide. A particular advantage of microwave heating is speed. The temperature of a pressed wafer one inch in diameter of the silicon-dopant oxide mixture can be raised in one to two minutes by microwave frequency energy to the reduction reaction temperature. The reduction reaction is initiated and completed so quickly that oxygen in air cannot react with the mixture. Therefore microwave heating is a particularly advantageous process since it permits the preparation of the novel dopant sources in air.

In order to achieve complete conversion of the dopant oxide in the mixture to elemental dopant, we find it important to include an excess number of silicon atoms in the mixture. That is, for every two oxygen atoms present in the mixture in a dopant oxide, there is more than one elemental silicon atom. This requirement ensures that there are more than enough silicon atoms present to bond to all the oxygen that may become available when reactions (1) and (2) take place. Because of the excess amount of silicon present and the intensity of reaction (1), the excess silicon becomes fused into a matrix formed of oxygen, silicon and dopant atoms. The matrix contains inclusions of elemental dopant atoms and, usually, inclusions of elemental silicon. For a wide range of dopant oxide-silicon mixture proportions, these fused matrices provide excellent mechanical support for the elemental dopant atoms that are evolved at high temperature in doping a semiconductor body.

If reduction of the concentration or quantity of dopant in a solid state source according to the invention is desired, an inert diluent may be added to the mixture, before the reduction reaction. The diluent should be a non-reacting material that is finely divided and intimately mixed with the dopant oxide and elemental silicon. Preferred diluents are aluminum oxide, silicon dioxide and combinations of them.

Antimony dopant sources according to the invention have been analyzed by various methods. X-ray diffraction analyses prove that only trace amounts of antimony trioxide remain in dopant sources prepared according to the invention. The results of other analyses are reported with respect to the specific examples described below.

EXAMPLE 1

Wafers ½ to 1 inch (12 to 25 mm) in diameter and about two millimeters or less in thickness were prepared by cold pressing a ball-milled mixture of 50 weight percent antimony trioxide and 50 weight percent elemental silicon. The prepared wafers were placed between silicon carbide sheets. The silicon carbide sheets were bombarded with microwave frequency electromagnetic energy until they reached a temperature of between 600° C. and 1000° C. The resulting dopant sources were tested in several ways.

Example 1 dopant sources wafers were used to dope silicon wafers in a conventional doping arrangement. A source was placed in a pair of grooves in a quartz boat and a p-type (100) orientation silicon wafer was placed in the adjacent set of grooves. The dopant source and silicon wafer were approximately the same size, approximately separated by about 0.060 to 0.080 inches (1.5 to 2 mm). A gas mixture of argon containing 1300 to 1800 parts per million of oxygen was passed over the dopant source and silicon wafer while they were heated in a furnace to 1250° C. for two hours per doping cycle. After each doping cycle, the doped silicon wafer was removed and a new undoped silicon wafer was substituted. The sheet resistivity of each doped silicon wafer was then measured with a four point probe. The results are shown in Table 1. These results show that the dopant source is capable of producing doping levels that are

TABLE 1

| Doping Cycle | Total Diffusion Time (Hours) | Source Weight Loss (mg) | Sheet Resistance of Doped Wafer (Ohms/Square) |
| --- | --- | --- | --- |
| 1 | 2 | 35.2 | 7.6–9.7 |
| 2 | 4 | 30.4 | 8.9–11.3 |
| 3 | 6 | 67.2 | 10.2–10.7 |
| 4 | 8 | 53.5 | 10.2–11.8 | of commercial importance and that the depletion rate of the source means that it has an acceptably long life. The evolution of antimony reduces the weight of the dopant source. The dopant source reported in Table 1 initially weighed 596 mg including 250 mg of antimony. The measured rate of weight change with time at a temperature of 1250° C. (after an initial one half hour at 1050° C.) is plotted in FIG. 1 for each of two samples (indicated by the large and small x entries) taken from this Example 1. In the graph of FIG. 1, the rate of weight loss in mg per gramhour is plotted on the ordinate while the time in hours is plotted on the abscissa. The narrow spread of the measurements shows the performance uniformity of dopant sources according to the invention.

Figure 2:
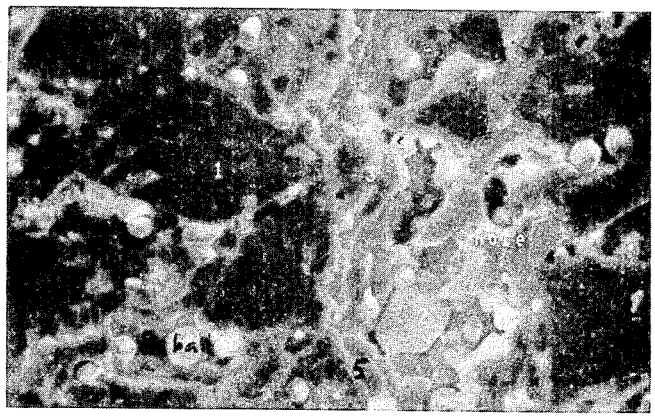
FIG. 2 is a scanning electron micrograph of an embodiment of a dopant source according to the invention.

The dopant sources produced in this example were examined with the scanning electron microscope to determine their structure. Energy dispersive x-ray emission analysis was used to identify the local composition of the structure. FIG. 2 is a scanning electron microscope micrograph showing the structure of a sample prepared by microwave heating. The areas identified by the numbers 1, 3, 4 and 5 are elemental silicon inclusions. The area identified by the number 2 is part of the fused matrix of silicon-oxygen-antimony that contains the inclusions. The area marked with the word ball is an elemental antimony inclusion.

A portion of one of the dopant source samples of this example was pulverized and analyzed by powder x-ray diffraction. The diffraction patterns confirmed the presence of elemental antimony and silicon in atomically ordered phases. However, no atomically ordered oxygen phases were detected indicating that the silicon-oxygen-antimony fused matrix is predominantly disordered, i.e. amorphous, in structure.

EXAMPLE 2

Figure 3:
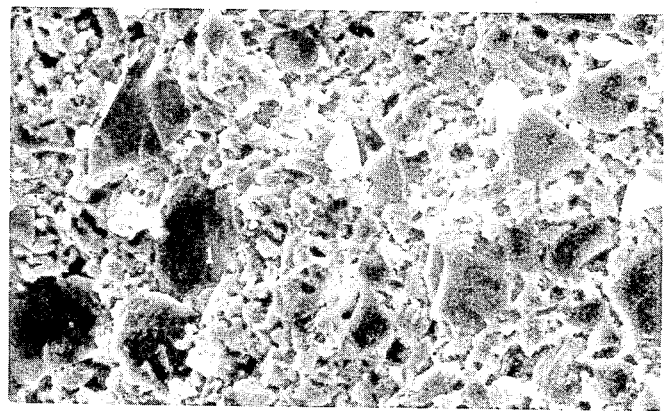
FIG. 3 is a scanning electron micrograph of an embodiment of a dopant source according to the invention.

Samples similar to those of Example 1 were made, but were heated in a furnace in an inert atmosphere, rather than being heated with electromagnetic energy at microwave frequencies. The measured rate of weight loss of a dopant source prepared by the furnace heating of a 50 weight percent silicon, 50 weight percent antimony trioxide mixture is plotted in FIG. 1 by the rectangular points. Little difference in the rate of weight loss is observed for this sample as compared to the weight loss rate for sources prepared by microwave heating. The microstructure of a sample prepared in a furnace is shown in the scanning electron microscope micrograph of FIG. 3. Area 1 is a representative inclusion of elemental silicon. The area marked with number 3 is an elemental antimony inclusion. The area marked 2 is a part of the complex silicon-oxygen-antimony matrix. Although the ball form of elemental antimony seen in FIG. 2 is absent from Figure 3, the microstructures shown are otherwise similar. Powder x-ray diffraction analysis confirms the presence in these samples of elemental silicon and antimony in atomically ordered phases and the absence of atomic order in the oxygen-containing phase.

In a test, we heated an antimony trioxide-silicon mixture in a furnace in the presence of air. The product of that reaction was analyzed by x-ray diffraction and no elemental antimony was detected. Instead, antimony tetraoxide was formed. This test confirmed that it is important to prevent external oxygen from reacting with the mixture if a useful dopant source is to be produced.

EXAMPLE 3

An antimony trioxide-silicon mixture containing 50 weight percent of each component was disposed on a porous silicon carbide foam support. Such porous refractory supports are described in U.S. Pat. No. 4,526,826 for Foam Semiconductor Dopant Carriers. The mixture was heated to its reaction temperature with microwave frequency electromagnetic energy and produced a hard adherent layer on the surface of the foamed silicon carbide. This porous dopant source was tested for the rate of dopant evolution by holding it at a temperature of 1050° C. for one half hour and thereafter maintaining the source at 1250° C. The measured weight loss of the source listed in Table 2 indicates a desirable slow rate of evolution of antimony. The source initially weighed 310 mg.

TABLE 2

| Time At Temperature (Hours) | Rate of Weight Loss (mg/g/Hour) |
| --- | --- |
| 0.5 | 78.1 |
| 1.0 | 18.7 |
| 1.5 | 27.8 |
| 2.0 | 36.8 |
| 2.5 | 29.7 |
| 4.5 | 38.9 |

Figure 4:
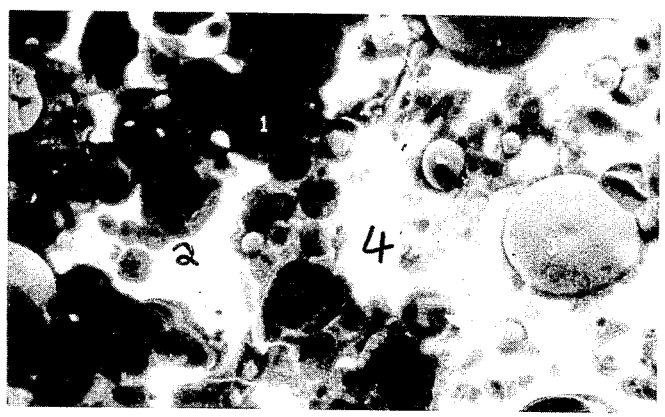
FIG. 4 is a scanning electron micrograph of an embodiment of a dopant source according to the invention.

Additional dopant sources were prepared by the method of Example 1, except that the composition of the mixture was changed to 68 weight percent antimony trioxide and 32 weight percent silicon. FIG. 4 is a scanning electron microscope micrograph of the dopant source structure produced from the 68/32 mixture. As with FIGS. 2 and 3, the FIG. 4 micrograph was made at a magnification of 1000. The area of FIG. 4 identified with the number 1 was determined by x-ray emission analysis to be elemental silicon; areas numbered 2 and 4 are parts of the fused silicon-oxygen-antimony matrix; and the area identified by number 3 was determined to be elemental antimony. By comparing FIGS. 2 and 4 it can be seen that the increased proportion of dopant oxide in the mixture increases the amount of the oxygen-containing fused matrix in the dopant source.

Figure 5:
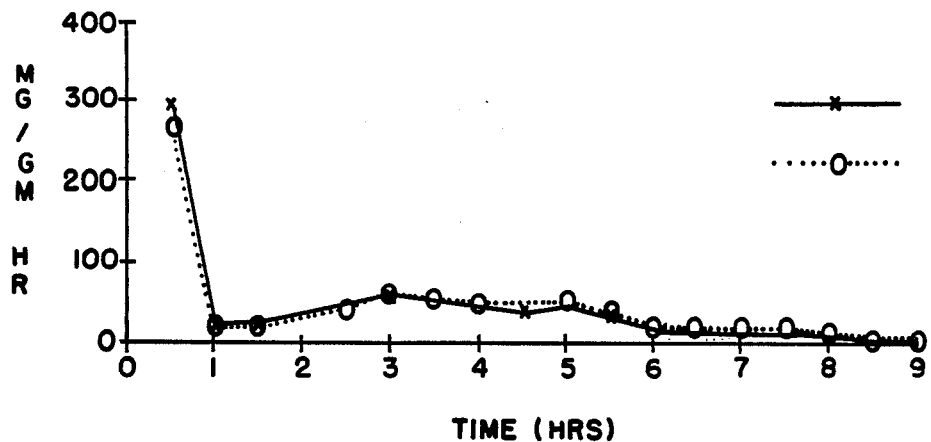
In FIG. 5 the measured rates of weight loss over time of embodiments of dopant sources according to the invention are plotted versus time at doping cycle temperature.
Figure 6:
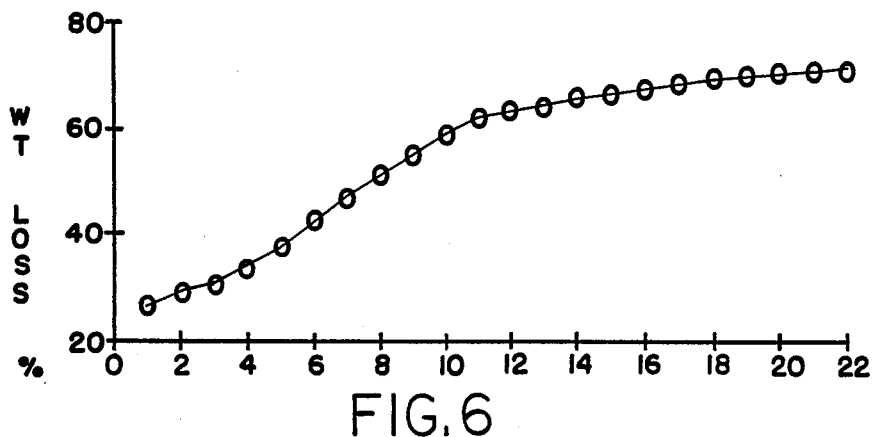
FIG. 6 is a measured plot of the cumulative percentage weight loss over a number of doping cycles by an embodiment of a dopant source according to the invention.

In FIG. 5 the rate of weight loss over time at 1250° C. of two dopant sources made in accordance with this Example 4 is plotted. These results demonstrate that the sources have acceptably long lives, relatively uniform weight loss rates during their useful lives and little variation in performance between samples. In FIG. 6 the cumulative percentage weight loss over a number of doping cycles is shown for another dopant source prepared from a 68/32 mixture. The percentage weight loss is plotted on the ordinate against the number of the doping cycle on the abscissa. Each doping cycle took place at 1250° C. for a duration of one half hour during which a mixture of argon containing five percent oxygen flowed over the dopant source and the semiconductor body being doped FIG. 6 demonstrates the long life and relatively uniform evolution of dopant from the source during the life of the source.

An additional important attribute of a useful dopant source is its ability to achieve a desired doping level in a semiconductor body. In many semiconductor device and integrated circuit manufacturing processes it is desirable to dope a semiconductor body relatively heavily in the presence of the source. Then the semiconductor body is removed from the influence of the dopant source. Thereafter the semiconductor body is held at or near the doping cycle temperature in order to diffuse the dopant atoms, and the junction they form, deeper into the semiconductor body. This is generally referred to as drive diffusion. Several of the 68/32 mixture dopant sources were tested to determine whether they could produce doped silicon wafers having surface sheet resistivities lower than a target 25 ohms per square after the drive diffusion. Dopant concentrations in silicon wafers doped by the novel sources were determined: (i) at the surface by measuring sheet resistivities; and (ii) with depth by secondary ion mass spectroscopy (SIMS) and by spreading resistance measurements on a wafer surface that had been beveled.

Figure 7:
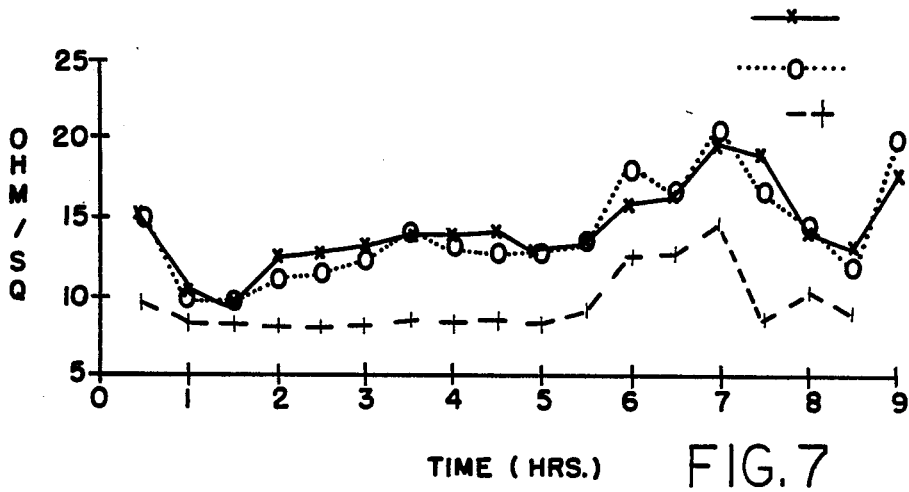
In FIG. 7 the measured sheet resistivities of the surfaces of doped semiconductor bodies produced in each of a number of doping cycles by embodiments of doping sources according to the invention are plotted against the total dopant cycle time of the sources, measured both before and after a drive diffusion.

In FIG. 7 the sheet resistivity in ohms per square is plotted for the semiconductor bodies doped in each of the doping cycles for which the weight loss rate is plotted in FIG. 5. The lines in FIG. 7 connecting x's and O's correspond to diffusions from dopant sources for which weight loss is plotted with the same symbols in FIG. 5. It is seen that as a source ages, the sheet resistivity it can produce in a semiconductor body begins to vary. However, even after 9 hours of doping service, corresponding to 17 doping cycles, the novel dopant sources still produce sheet resistivities falling well below the 25 ohms per square target. The lowest line in FIG. 7, i.e. the dashed line, shows the measured sheet resistivity after a drive diffusion of 1.5 hours duration at 1250° C.

Figure 8A:
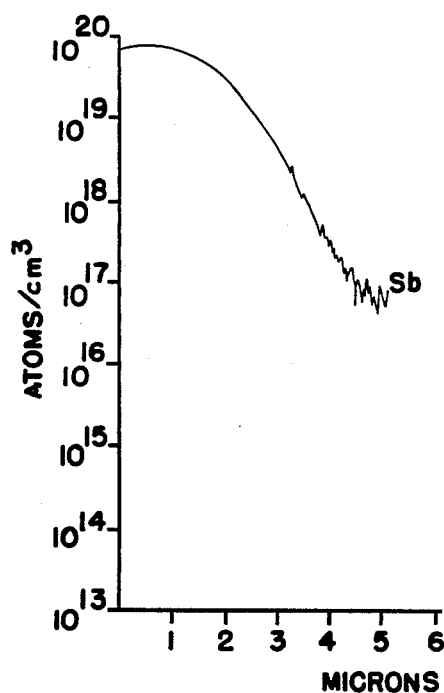
FIGS. 8A and 8B are plots of measured dopant concentration versus depth in a semiconductor body that has been doped according to the invention, measured after a drive diffusion.
Figure 8B:
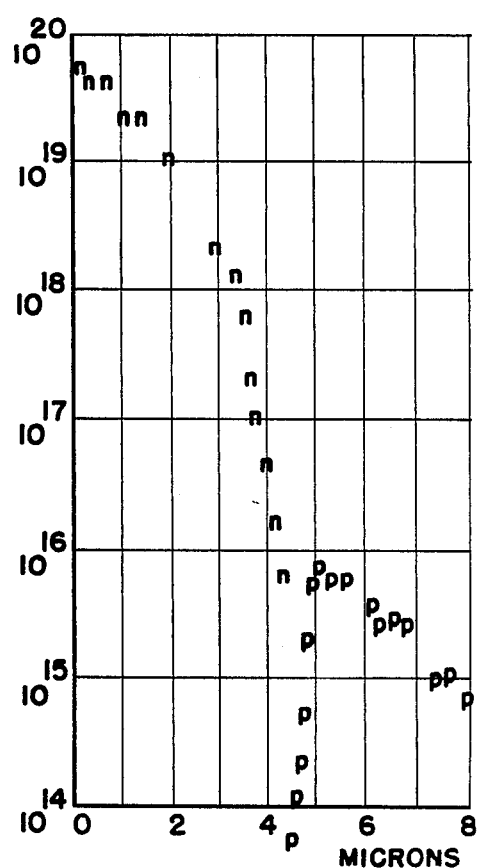

The concentration gradient of antimony in a silicon semiconductor body doped according to the invention is plotted in FIGS. 8A and 8B. The dopant source was made from the 68/32 mixture and the silicon body was doped from the first doping cycle of that source at 1250° C. for one half hour. Thereafter, the semiconductor body was subjected to a drive diffusion. In FIG. 8A the results of a SIMS analysis shows an antimony concentration of about $8 \times 10^{19}$ atoms/cm$^3$ at the surface declining to about $2 \times 10^{17}$ atoms/cm$^3$ at a depth of about 4 micrometers. FIG. 8B reports the results of spreading resistance measurements in which the doped body is beveled at a very small angle to "extend" the depth gradient. The spreading resistance measured along the beveled surface is plotted in FIG. 8B, correcting for the bevel. FIG. 8B shows a surface concentration of about 5 to $6 \times 10^{19}$ carriers/cm$^3$ and a junction at a depth of about 4.3 micrometers where the net carrier concentration is theoretically zero. At a 4 micrometer depth, the carrier concentration is about $5 \times 10^{16}$ carriers/cm$^3$. Since SIMS measures the number of atoms present whereas the spreading resistance measurement reveals only the number of electrically active dopant atoms, a smaller number, the correlation between these measurements is extremely good.

Figure 9A:
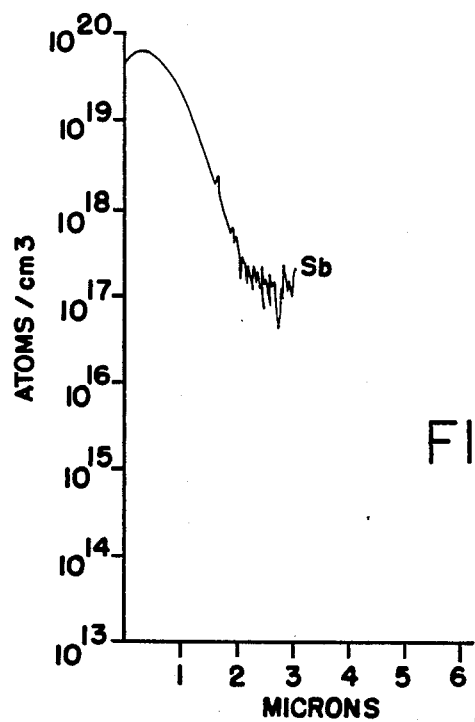
FIGS. 9A, 9B, 9C and 9D are plots of measured dopant concentration versus depth in a semiconductor body that has been doped according to the invention, measured both before and after a drive diffusion.
Figure 9B:
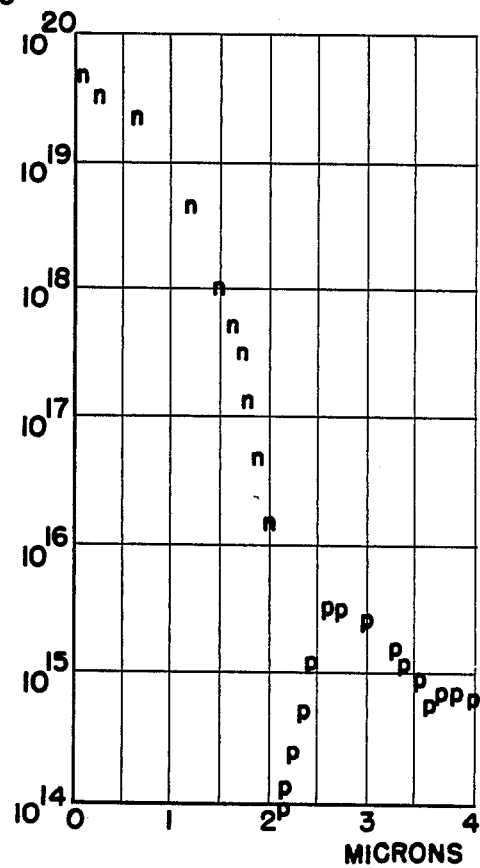
Figure 9C:
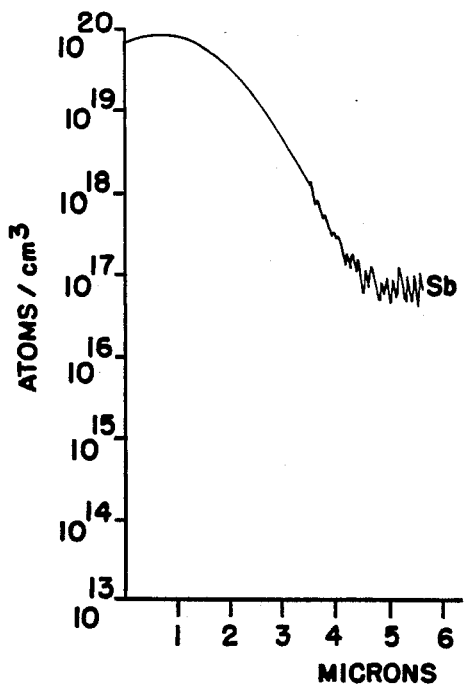
Figure 9D:
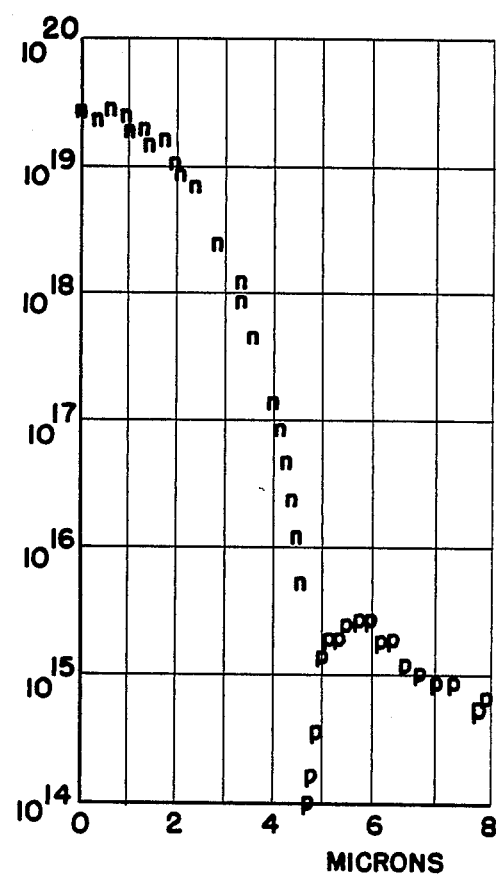

To verify the lifetime of the dopant source, SIMS and spreading resistance measurements were made on the semiconductor body doped by that source in its ninth doping cycle. These results are shown in FIGS. 9A and 9B for the body as-doped and in FIGS. 9C and 9D after a drive diffusion. The as-doped body showed a surface dopant concentration of about $8 \times 10^{19}$ atoms/cm$^3$ and a concentration at a depth of 2 micrometers of about $2 \times 10^{17}$ atoms/cm$^3$ according to SIMS measurements (FIG. 9A). The spreading resistance measurements show a surface carrier concentration of about $5 \times 10^{19}$ carriers/cm$^3$ and a concentration of about $1.6 \times 10^{16}$ carriers/cm$^3$ at a 2 micrometer depth (FIG. 9B). After a drive diffusion, the SIMS measurements changed to about $6 \times 10^{19}$ atoms/cm$^3$ at the surface and, at 4.5 micrometers depth, $9 \times 10^{16}$ atoms/cm$^3$ (FIG. 9C). The spreading resistance method showed a surface concentration of about $3 \times 10^{19}$ carriers/cm$^3$ while at 4.5 micrometers depth the carrier concentration was $4 \times 10^{16}$ per cm$^3$ (FIG. 9D). Again, there is very good correlation in these measurements confirming their accuracy. The p-n junction in the body moved from a depth of about 2.2 micrometers to a depth of about 4.4 micrometers as a result of the drive diffusion. A comparison of FIGS. 8B and 9D shows that repeatable junction depths are obtained from a dopant source according to the invention no matter whether the first or ninth dopant cycle is used. The other figures show that repeatable performance is expected from the first doping cycle through at least the seventeenth doping cycle.

EXAMPLE 5

Additional examples of dopant sources were prepared from a 68/32 weight percent mixture of antimony trioxide and silicon. However, these samples were formed into cylinders 2 and 3 inches (50 and 75 mm) in diameter by hot pressing. The powder mixture was placed in a sleeve closed by graphite end plugs to which pressure could be applied during the heating process to stress the mixture. Thus the term hot pressing. The apparatus used is conventional in the refractory industry. Two inch diameter cylinders were pressed at 250 and 1500 pounds per square inch (176,000 and 1,055,000 kg/m$^2$); three inch diameter cylinders were pressed at 250 pounds per square inch (176,000 kg/m$^2$). The cylinders were heated under pressure to a final temperature of about 750° C. to ensure that the reduction reaction took place. External oxygen was excluded from the cylinders being hot pressed. Heating required about 45 minutes.

After the reacted cylinder were cooled, wafers were sawn from them as dopant sources. These doping wafers were as useful in doping silicon as the other sources previously described. The measured performance of dopant sources sawn from cylinders is illustrated in FIGS. 10 and 11.

Figure 10:
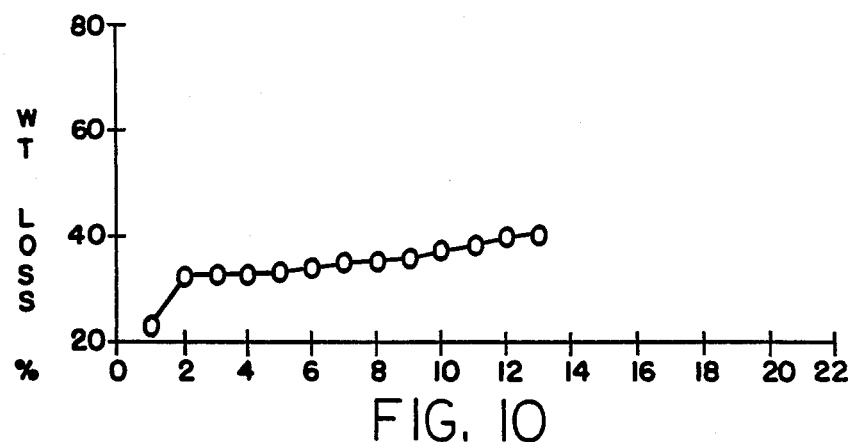
FIG. 10 is a measured plot of the cumulative percentage weight loss over a number of doping cycles by an embodiment of a dopant source according to the invention.
Figure 11:
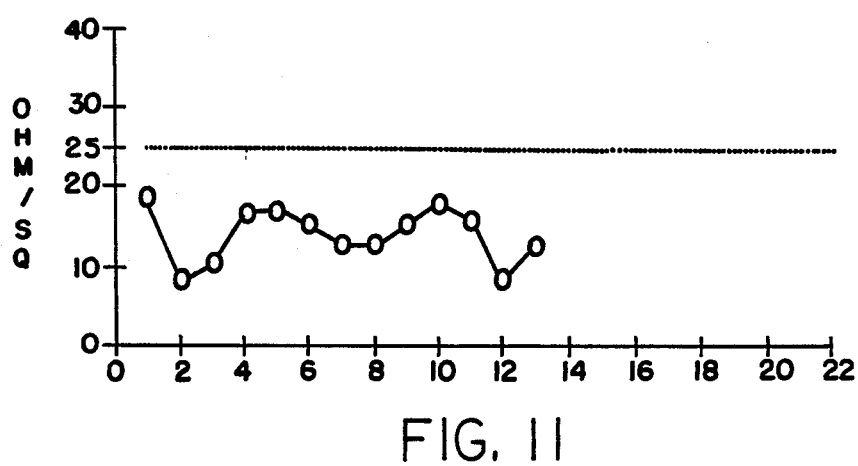
FIG. 11 is a plot of the measured sheet resistivities of the surfaces of doped semiconductor bodies produced in each of a number of doping cycles by an embodiment of a doping source according to the invention and subjected to a drive diffusion.

In FIG. 10, the cumulative percentage weight loss of a dopant source according to this Example 5 is plotted against the number of doping cycles. Each doping cycle lasted one half hour at 1250° C. during which argon containing 5 percent oxygen was passed over the source and the silicon body to which evolving dopant atoms were being transported. FIG. 10 shows a nearly linear, slow evolution of antimony through the doping cycles with a substantial percentage of the dopant atoms remaining in the source after 13 cycles.

The silicon wafers that were doped from sources according to this Example were later subjected to a drive diffusion lasting 1.5 hours at 1250° C. The argon, 5 percent oxygen mixture was passed over the doped wafers during the drive diffusion. Thereafter, the sheet resistivities of the doped surfaces of the silicon wafers were measured. Those values are plotted in FIG. 11 against the doping cycle in which the doping took place. All wafers had resistivities below the 25 ohms per square upper limit further indicating that the source had not neared the end of its useful life after 13 doping cycles.

EXAMPLE 6

An attempt was made to prepare yet another dopant source from a mixture of 86 weight percent antimony trioxide and 14 percent silicon. The mixture was pressed into a wafer shape and heated with electromagnetic energy at microwave frequencies to reduce the antimony trioxide. The reduction product was very porous compared to the dopant sources already described and lacked physical strength. When the product was raised in temperature to 1250° C. in a doping trial, it sagged and curled, making it unusable in the usual doping process where mechanical stability is important. The composition may be useful as a dopant if supported, for example, if disposed on foamed silicon carbide.

Figure 12:
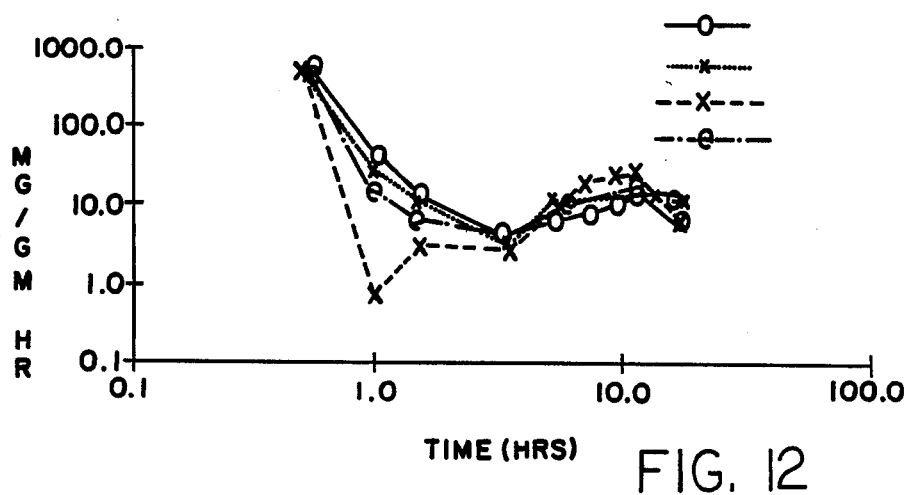
In FIG. 12 the measured rates of weight loss over time of embodiments of dopant sources are plotted versus time at doping cycle temperature.

Although the samples prepared according to this Example 6 lack mechanical stability, the rate of weight loss of several of the samples was measured at 1250° C. The measured rates are plotted in FIG. 12 against the time the samples were subjected to the elevated temperature.

Figure 13:
FIG. 13 is a scanning electron micrograph of an embodiment of a dopant source.

A scanning electron microscope micrograph and corresponding x-ray spectroscopy analyses show that these samples have the fused silicon-oxygen-antimony matrix containing silicon and antimony inclusions. A micrograph of the structure of one of the samples appears in FIG. 13 where the matrix is identified by the numbers 2 and 3, elemental antimony is given the number 1 and elemental silicon is given the number 4.

The invention has been described with respect to certain preferred embodiments. Various modifications and additions within the spirit of the invention will occur to those of skill in the art. Therefore the scope of the invention is limited solely by the following claims.

We claim:

1. A method of making a planar solid state dopant source comprising:
    mixing together particles of silicon and particles of an oxide of a dopant selected from the group consisting of antimony and boron to form a mixture containing more than half as many silicon atoms as oxygen atoms; and
    heating said mixture to a temperature sufficient to reduce said oxide and to oxidize said silicon while preventing ambient oxygen from reacting with the constituents of said mixture, to form a fused silicon-oxygen-dopant matrix containing elemental dopant inclusions.

2. The method of claim 1 including selecting antimony as said dopant and antimony trioxide as said oxide.

3. The method of claim 2 wherein said mixture includes more than 10 and less than 86 weight percent of antimony trioxide.

4. The method of claim 2 wherein said mixture includes from 50 to 68 weight percent of antimony trioxide.

5. The method of claim 1 including forming said mixture into a desired shape.

6. The method of claim 5 including forming said mixture into a desired shape by pressing before heating it.

7. The method of claim 1 including applying pressure to said mixture while heating it.

8. The method of claim 1 including heating said mixture to a temperature between 500° C. and 750° C.

9. The method of claim 1 including heating said mixture to a temperature between 500° C. and 600° C.

10. The method of claim 1 including heating said mixture in a furnace and preventing ambient oxygen from reacting with the mixture by flowing an inert gas around said mixture.

11. The method of claim 1 including heating said mixture with electromagnetic energy.

12. The method of claim 11 including disposing said mixture on an absorber of electromagnetic energy and bombarding said absorber with electromagnetic energy.

13. The method of claim 11 including heating said mixture with electromagnetic energy at a microwave frequency.

14. The method of claim 1 including adding particles of a non-reacting material to said mixture as a diluent.

15. The method of claim 14 including adding at least one of aluminum oxide and silicon dioxide to said mixture as said non-reacting material.

16. The method of claim 1 including disposing said mixture on a porous, refractory support before heating it.

17. A planar solid state antimony dopant source comprising a fused silicon-oxygen-antimony matrix containing more than 9 and less than 72 weight percent of antimony and containing inclusions of elemental antimony atoms.

18. The dopant source of claim 17 wherein said fused matrix contains inclusions of elemental silicon.

19. The dopant source of claim 17 wherein said source contains 41 to 57 weight percent of antimony.

20. The dopant source of claim 17 containing an oxide to dilute the concentration of said elemental antimony.

21. The dopant source of claim 20 wherein said diluent oxide is at least one of aluminum oxide and silicon dioxide.

22. The dopant source of claim 17 wherein said fused matrix and inclusions are disposed on the surface of a porous refractory support.

23. The dopant source of claim 22 wherein said support comprises foamed silicon carbide.

24. A method of doping a silicon semiconductor body with antimony comprising:
    disposing a planar solid state dopant source body comprising a fused silicon-oxygen-antimony matrix containing inclusions of elemental antimony atoms proximate, but not in touching contact with, a silicon semiconductor body to be doped;
    maintaining said semiconductor body and dopant source in a controlled gaseous ambient; and
    raising the temperature of said source and semiconductor body to a temperature sufficient to evolve antimony atoms from said dopant source and to diffuse into said silicon body evolved antimony atoms that contact said semiconductor body.

25. The method of claim 21 including raising the temperature of said dopant source and said silicon semiconductor body to between about 1100° C. and 1300° C.

26. The method of claim 24 including maintaining a controlled gaseous ambient by flowing a gaseous mixture including an inert gas and oxygen around said dopant source and said silicon semiconductor body.

27. The method of claim 26 including flowing a gaseous mixture containing argon and between about 1300 and 50,000 parts per million of oxygen.

28. A planar solid state antimony dopant source comprising a support and a fused silicon-oxygen-antimony matrix containing at least 72 weight percent of antimony and containing inclusions of elemental antimony atoms disposed on said support.

29. The dopant source of claim 28 wherein said support is a porous, refractory body.

* * * * *